United States Patent [19]
Apte et al.

[11] Patent Number: 5,593,924
[45] Date of Patent: Jan. 14, 1997

[54] USE OF A CAPPING LAYER TO ATTAIN LOW TITANIUM-SILICIDE SHEET RESISTANCE AND UNIFORM SILICIDE THICKNESS FOR SUB-MICRON SILICON AND POLYSILICON LINES

[75] Inventors: Pushkar P. Apte, Dallas; Ajit P. Paranjpe, Plano, both of Tex.

[73] Assignee: Texas Instruments Incorporated, Dallas, Tex.

[21] Appl. No.: 460,345

[22] Filed: Jun. 2, 1995

[51] Int. Cl.[6] ................................................. H01L 21/28
[52] U.S. Cl. ........................... 437/200; 437/190; 437/192; 437/193; 437/46
[58] Field of Search ................................... 437/193, 200, 437/46, 247, 190, 192; 148/DIG. 15

[56] References Cited

U.S. PATENT DOCUMENTS

| | | | |
|---|---|---|---|
| 4,665,608 | 5/1987 | Okamoto et al. | 148/DIG. 14 |
| 4,682,407 | 7/1987 | Wilson et al. | 437/24 |
| 4,804,636 | 2/1989 | Groover, III et al. | 437/200 |
| 4,886,764 | 12/1989 | Miller et al. | 437/200 |
| 4,923,822 | 5/1990 | Wang et al. | 437/200 |
| 4,933,994 | 6/1990 | Orban | 437/200 |
| 5,034,348 | 7/1991 | Hartswick et al. | 437/200 |
| 5,094,981 | 3/1992 | Chung et al. | 437/200 |
| 5,384,285 | 1/1995 | Sitaram et al. | 437/200 |

OTHER PUBLICATIONS

S. Wolf "Silicon Processing for the VLSI Era, vol. 2", Lattice Press, 1990, pp. 132, 144, 145, 147–149.

*Primary Examiner*—John Niebling
*Assistant Examiner*—Thomas G. Bilodeau
*Attorney, Agent, or Firm*—Jacqueline J. Garner; Richard L. Donaldson; William E. Hiller

[57] ABSTRACT

A titanium-silicide process using a capping layer to reduce the silicide sheet resistance. A layer of titanium (20) is deposited. A react capping layer (22) may then be deposited to prevent contaminants from entering the titanium layer (20)during the subsequent react step. The layer of titanium (20) is then reacted to form titanium-silicide (32). The react capping layer (22) is then removed and an anneal capping layer (36) is deposited to prevent contaminants from entering the silicide layer (32) during the subsequent anneal step. Then, the silicide anneal is performed to accomplish to transformation to a lower resistivity phase of silicide. An advantage of the invention is providing a silicide process having reduced silicide sheet resistance for narrow polysilicon lines.

10 Claims, 1 Drawing Sheet

5,593,924

USE OF A CAPPING LAYER TO ATTAIN LOW TITANIUM-SILICIDE SHEET RESISTANCE AND UNIFORM SILICIDE THICKNESS FOR SUB-MICRON SILICON AND POLYSILICON LINES

CROSS-REFERENCE TO RELATED APPLICATION

The following co-pending U.S. patent application is hereby incorporated by reference:

| Ser. No. | Filing date | Inventor |
| --- | --- | --- |
| 08/459,203 | 06/02/95 | Paranjpe et al. |

FIELD OF THE INVENTION

This invention generally relates to semiconductor processing and more specifically to titanium silicide formation on narrow polysilicon lines.

BACKGROUND OF THE INVENTION

A typical titanium silicide process consists of four steps: titanium deposition, a silicide react step, a TiN (titanium nitride) strip, and a silicide anneal. During the react step, titanium is reacted in a $N_2$ (nitrogen) ambient to fore titanium-silicide where the titanium reacts with silicon, and TiN is formed elsewhere. The silicide formed during the react step is typically present in a higher resistivity phase known as C49. TiN strip step removes the TiN layer formed during the react step. The anneal step is then used to transform the high resistivity C49 silicide phase into a lower resistivity silicide phase known as C54.

Silicide cladding of the polysilicon gate and the source/drain regions in VLSI (very large scale integrated) circuits using titanium silicide is a popular approach for reducing the transistor series resistance and local interconnect delays in VLSI circuits. The sheet resistance of heavily doped, silicided polysilicon lines is known to be a function of linewidth, particularly for sub-micron linewidths. One explanation for this is that a lower percentage of the silicide transforms from the higher resistivity C49 phase to the lower resistivity C54 phase on sub-0.5 µm polysilicon lines. Another explanation is non-uniform silicide formation. Sheet resistances for linewidths under 0.5 µm are particularly problematic. Hence, there is a need to alleviate this problem and reduce the dependence of the silicide sheet resistance on linewidth.

Several methods have been used to reduce the titanium-silicide sheet resistance. One method of reducing the silicide sheet resistance is to increase the temperature of the anneal. However, higher temperature leads to agglomeration of the silicide. Higher temperature also leads to lateral overgrowth of the silicide which is unacceptable for self-aligned silicide processing. Lateral overgrowth results in undesirable conductive silicide stringers between the polysilicon gate and the source/drain region of MOS transistors. Therefore, an alternative method is desirable for reducing silicide sheet resistance.

A method that has been used in conjunction with cobalt-silicide includes a titanium nitride capping layer. The titanium-nitride capping layer is used during the silicide react step to reduce cobalt overgrowth on oxide areas and reduce the variability of the sheet resistance. The titanium nitride capping layer reduces oxygen contaminants in the cobalt silicide. By reducing the contaminants in the forming silicide layer, the sheet resistance of the cobalt silicide is reduced.

SUMMARY OF THE INVENTION

A titanium-silicide process using a capping layer is disclosed herein. A layer of titanium is deposited over the polysilicon/silicon area. A react capping layer, for example TiN, may optionally be deposited over the titanium layer. A silicide react is then performed with the react capping layer in place to form a silicide layer in a predominantly higher resistivity phase C49. The react capping layer, if present, is then removed. An anneal capping layer is then deposited over the silicide layer to provide a barrier and prevent contaminants from being incorporated into the silicide layer. The structure is then annealed with the anneal capping layer in place to transform the silicide layer to a predominantly lower resistivity phase C54.

An advantage of the invention is providing a silicide process having reduced sheet resistance for narrow polysilicon lines.

Another advantage of the invention is providing a silicide process having reduced sheet resistance that is compatible with conventional CMOS processing and does not add thermal, lithography or energetic-ion steps to conventional silicide processing.

These and other advantages will be apparent to those skilled in the art having reference to the specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
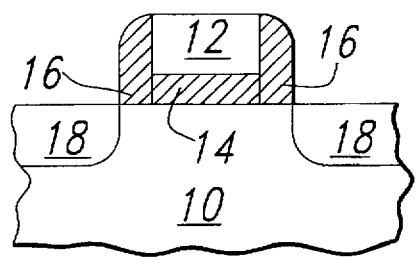
FIG. 1 is a cross-sectional view of a semiconductor body upon which the silicide process according to the invention may be performed.

The invention is an improved silicide process providing reduced sheet resistance for narrow, silicided polysilicon lines. The invention is particularly suited for sub-0.5 µm polysilicon lines. FIG. 1 illustrates a typical semiconductor body 10 for which silicide processing is desired. Semiconductor body 10 is shown processed through source/drain anneal. A polysilicon gate 12 is separated from semiconductor body 10 by gate oxide 14. Sidewall dielectric 16 is located on the sidewalls of polysilicon gate 12. Source/drain regions 18 in semiconductor body 10 lie adjacent to polysilicon gate 12. The silicide process according to the invention performed on the structure of FIG. 1 will now be described.

Figure 2:
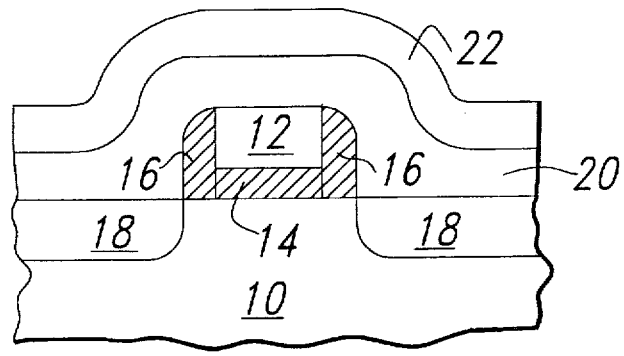
FIGS. 2–6 are cross-sectional view of the semiconductor body of FIG. 1 at various stages of the silicide process according to the invention.

A layer of titanium 20 is deposited over the structure as shown in FIG. 2 to a thickness on the order of 200–500 Å. For example, sputter-deposition at a temperature on the order of 250°–450° C. may be used to deposit titanium layer 20. If desired, a pre-react amorphization implant of a heavy species such as arsenic may be performed after titanium layer 20 has been deposited or just prior to the deposition of titanium layer 20. A more detailed description of the pre-react amorphization implant may be found in co-pending U.S. patent application No. 08/459,203, filed on Jun. 2, 1995 by Paranjpe et al and assigned to Texas Instruments, Inc.

A react capping layer 22 is then deposited over titanium layer 20 as shown in FIG. 2. React capping layer 22 is optional, but preferred, as will be discussed further below. React capping layer 22 preferably comprises TiN. However, other barrier materials may be used provided they do not react with titanium layer 20 or with subsequent process steps. For example, silicon-nitride, titanium tungsten, or metal carbides may be used for react capping layer 22. React capping layer 22 is deposited to a thickness on the order of 200–2000 Å, preferably on the order of 500 Å.

Figure 3:
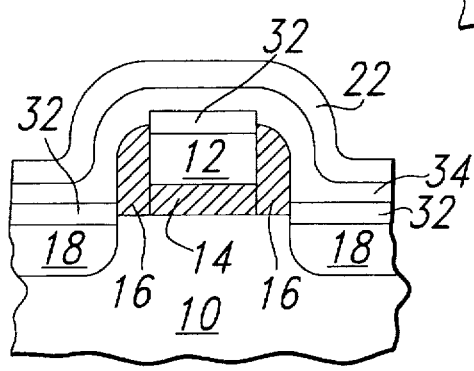

Next, silicide layer 32 is formed by reacting titanium layer 20 in a nitrogen-containing ambient as shown in FIG. 3. Silicide layer 32 forms over silicon (i.e., source/drain regions 18 and polysilicon gate 12). If capping layer 22 is omitted, a TiN layer, layer 34, forms elsewhere (including over silicide layer 32) from the reaction of titanium layer 20 with nitrogen. Layer 34 may also comprise some unreacted titanium. Even in the presence of a capping layer, layer 34 (TiN/Ti), may form due to diffusion of nitrogen from the ambient, or due to reaction with capping layer 22, if layer 22 contains nitrogen (e.g. if layer 22 is TiN or silicon nitride.) In both embodiments (with and without a capping layer), layer 34, which is a combination of TiN and unreacted titanium, may form during the silicide react step. Conventional techniques may be used to accomplish the silicide react step. For example, a rapid thermal processor may be used to perform the silicide react step in a nitrogen ambient at a temperature on the order of 695° C. for a duration on the order of 60 seconds. Temperatures in excess of 600° C. are desirable so that the high temperature of the silicide react step aids in annealing out the damage caused by the optional pre-react amorphization implant. However, temperatures should remain below the order of 950° C. to prevent agglomeration of the silicide. Further, to prevent lateral overgrowth that causes silicide stringers between the gate and source/drain regions of the MOS device, temperaturees should remain below the order of 750° C.

Figure 4:
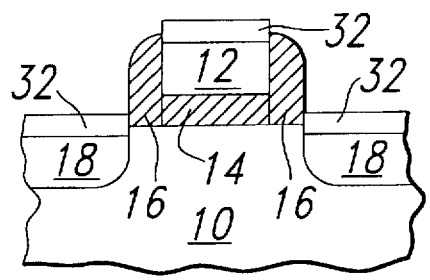

After the silicide react step, react capping layer 22 and layer 34 are removed as shown in FIG. 4. As an example, a megasonic bath in ammonium-hydroxide and water (NH4OH:H2O2:H2O) may be used for a duration on the order of 30 minutes.

Next, pre-anneal amorphization implant may optionally be performed as described in co-pending U.S. patent application No. 08/459,203 filed Jun. 2, 1995 by Paranjpe et al and assigned to Texas Instruments, Inc. The pre-anneal amorphization implant is a low dose, low energy implant and preferably uses a heavy species such as arsenic, antimony and germanium. For example, arsenic may be implanted at $2.0 \times 10^{14}$/cm$^2$ at 50 keV.

Figure 5:
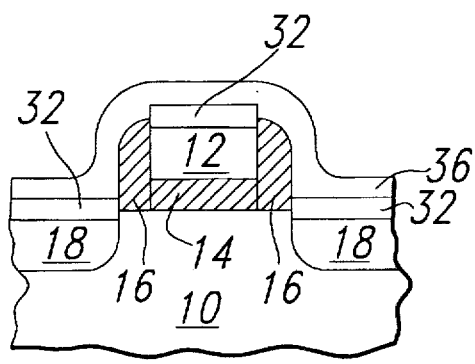

After the optional pre-anneal amorphization implant, an anneal capping layer 36 may be deposited over silicide layer 32, as shown in FIG. 5. Either the react capping layer 22 (during silicide react) or the anneal capping layer 36 (during silicide anneal) may be used, or both of them may be used. In the preferred embodiment, both the react and anneal capping layers 22,36 are used. Like the react capping layer 22, the anneal capping layer 36 preferably comprises TiN. However, other barrier materials may be used provided they do not react with silicide layer 32 or with subsequent process steps. For example, silicon-nitride, titanium-tungsten, or metal carbides may also be used for second capping layer 36. Anneal capping layer 36 is deposited to a thickness on the order of 200–2000 Å, preferably on the order of 500 Å.

After the anneal capping layer 36 is deposited, a silicide anneal is performed. Higher temperatures are used for the silicide anneal than for the silicide react step. Temperatures approaching that used for the source/drain and gate anneal processes (e.g., on the order of 850°–900° C.) are desirable. One exemplary anneal is an anneal at 850° C. for 30 seconds. The silicide anneal repairs damage that occurs from both the pre-react and pre-anneal amorphization implants, provided the temperature of the anneal is in excess of 600° C. (Temperatures should however, remain below the order of 950° C. which would cause agglomeration of the silicide layer 32.)

The silicide anneal transforms the silicide layer 32 from a higher resistivity phase C49 to a lower resistivity phase C54. In prior art silicide processes, it is believed that a lower percentage of the silicide transforms to the low resistivity phase C54 in sub-0.5 μm polysilicon lines due to contaminants and local stress-states within silicide layer 32. However, the react and capping layers 22, 36 prevent contaminants from entering silicide layer 32 during the silicide react and silicide anneal steps. Thus, a higher percentage of silicide layer 32 transforms into the lower resistivity C54 phase and the sheet resistance is reduced. The pre-amorphization implants also aid in reducing sheet resistance by aiding in the transformation to the lower C54 phase. Thus, a low sheet resistance is obtained by the present invention even for narrow polysilicon lines (i.e, sub-0.5 μm).

Figure 6:
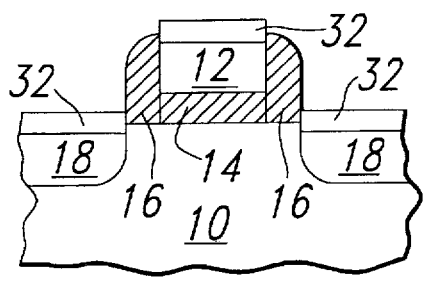

At the completion of the silicide processing described above, the anneal capping layer 36 is removed as shown in FIG. 6 and device fabrication may continue as is known in the art. For example, an interlevel dielectric layer may be formed with contacts extending therethrough to connect to various portions of silicide layer 32. This may be followed by forming a multi-level metal interconnect for interconnecting various devices of semiconductor body 10.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A silicide process for a polysilicon line, comprising the steps of:

depositing a layer of titanium over said polysilicon line;

reacting said layer of titanium with said polysilicon line to create a silicide layer with an overlying titanium nitride layer;

removing said titanium nitride layer;

depositing an anneal capping barrier layer on said silicide layer, said anneal capping barrier layer comprising a material selected from the group consisting of titanium-nitride, titanium-tungsten, silicon-nitride, and metal carbides; and annealing said silicide layer at a temperature greater than 600° C. after said depositing an anneal capping barrier layer step.

2. The silicide process of claim 1, wherein said anneal capping barrier layer is deposited to a thickness on the order of 200–2000 Å.

3. The silicide process of claim 1, further comprising the step of depositing a react capping layer over said layer of titanium prior to said reacting step.

4. The silicide process of claim 1, further comprising the step of performing a pre-anneal amorphization implant of said silicide layer prior to said annealing step to amorphize a surface of said silicide layer.

5. The silicide process of claim 4, further comprising the step of performing a pre-react amorphization implant of said polysilicon line prior to said reacting step to amorphize a surface of said polysilicon line.

6. A silicide process for a semiconductor body having a polysilicon line, comprising the steps of:

depositing a layer of titanium over said polysilicon line;

depositing a react capping layer over said polysilicon line;

reacting said layer of titanium with said polysilicon line after said step of depositing said react capping layer to create a silicide layer and a layer of titanium nitride, wherein said react capping layer prevents contaminants from entering said silicide layer during said reacting step;

stripping said layer of titanium nitride and said capping layer;

depositing an anneal capping layer over said silicide layer after said stripping step; and annealing said silicide layer at a temperature on the order of 850° C., wherein said anneal capping layer prevents contaminants from entering said silicide layer during said annealing step.

7. The silicide process of claim 6, further comprising the step of performing a pre-react amorphization implant of said polysilicon line prior to said reacting step by implanting a species selected from the group consisting of arsenic, antimony, and germanium to amorphize a surface of said polysilicon line.

8. The silicide process of claim 7, further comprising the step of performing a pre-anneal amorphization implant of said silicide layer prior to said annealing step by implanting a species selected from the group consisting of arsenic, antimony, and germanium to amorphize a surface of said silicide layer.

9. A silicide process comprising the steps of:

depositing a titanium layer over a polysilicon layer;

depositing a first layer of titanium nitride over said titanium layer;

reacting said titanium layer with said polysilicon layer to form a silicide layer;

removing said first titanium nitride layer;

depositing a second layer of titanium nitride over said silicide layer;

annealing said silicide layer; and removing the second titanium nitride layer.

10. The silicide process of claim 9, wherein said first and second titanium nitride layers have a thickness on the order of 200–2000 Å.

* * * * *